Aug. 8, 1967 K. A. WITTIG ET AL 3,335,370

HIGH LEVEL AMPLITUDE MODULATION OF TRANSISTOR RADIO FREQUENCY AMPLIFIERS

Filed March 31, 1965

GEORG G. LUETTGENAU,
KURT A. WITTIG,
INVENTORS.

BY THEIR ATTORNEYS

Spensley & Horn.

United States Patent Office 3,335,370

Patented Aug. 8, 1967

3,335,370

HIGH LEVEL AMPLITUDE MODULATION OF TRANSISTOR RADIO FREQUENCY AMPLIFIERS

Kurt A. Wittig, Los Angeles, and Georg G. Luettgenau, Redondo Beach, Calif., assignors to TRW Semiconductors, Inc., Lawndale, Calif., a corporation of Delaware Filed Mar. 31, 1965, Ser. No. 455,667
4 Claims. (Cl. 325—105)

ABSTRACT OF THE DISCLOSURE

This invention provides a transistor high level amplitude modulation circuit which results in nearly linear instantaneous response of the output signal to the voltage variation of the input signal. The output voltage signal of the secondary of a transformer is applied to the tank circuit of a driver amplifier through a pair of diodes. The diodes are so poled or oriented as to apply the instantaneous modulation voltage signal to the driver amplifier and a subsequent power amplifier stage only during the upward modulating phase of the modulating signal and to the power amplifier stage only (and not to the driver amplifier stage) during the downward modulating signal phase. This serves to compensate for the inherent non-linearity of transistor amplifiers used in amplitude modulation systems which is more pronounced during the upward phase position of any input signal being amplified.

Figures 1, 2:
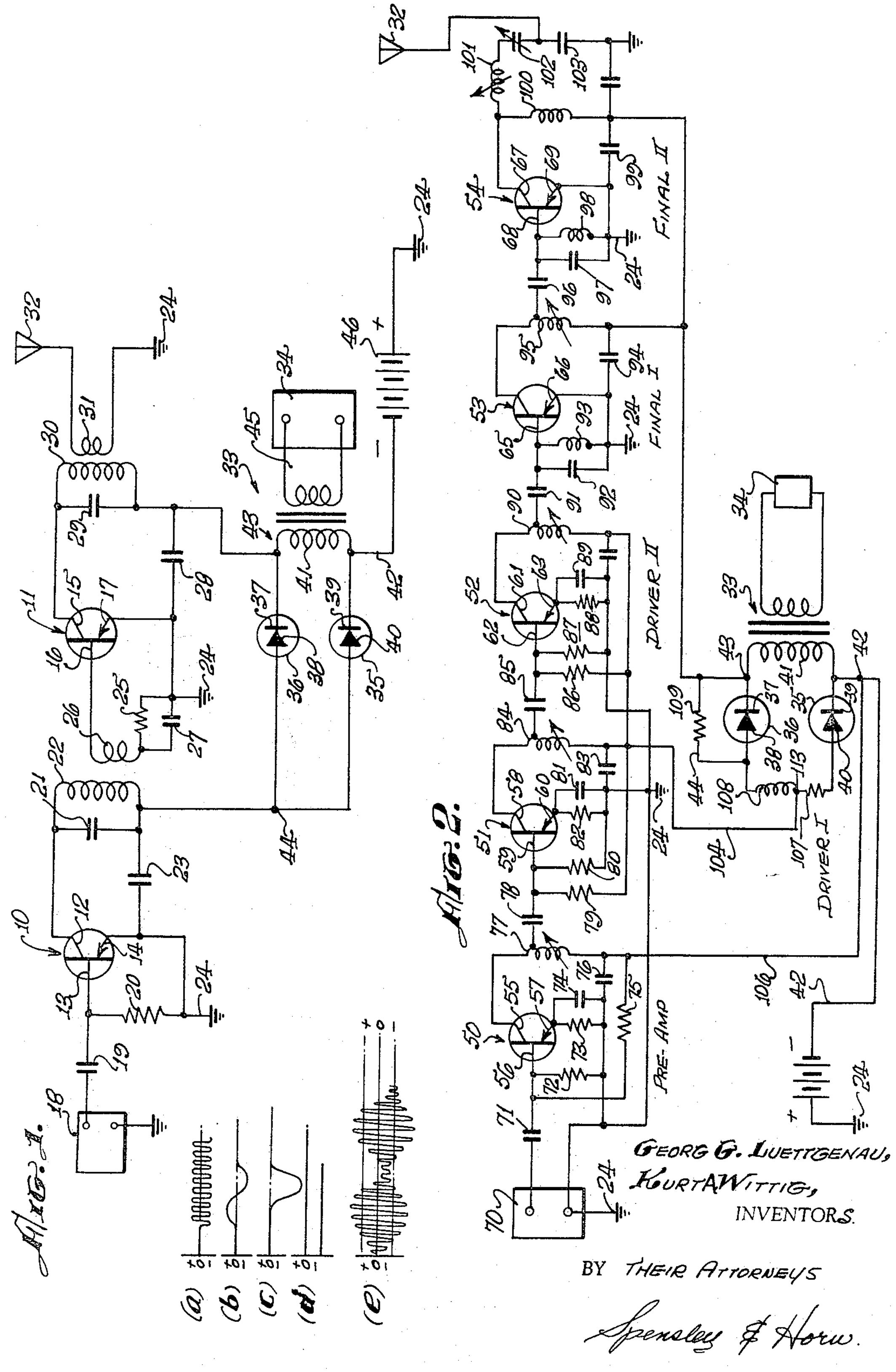

One of the problems encountered in amplitude modulation of transistor power amplifiers is that during the half cycle of the modulating envelope when the modulating signal polarity is opposed to the collector supply polarity, of such transistor power amplifiers carrier clipping generally results if the full modulation of the carrier amplitude is attempted. Because of the clipping action which occurs at a low power portion of the modulating cycle no more than a modulation depth of 70% to 80% can be achieved.

This invention contemplates a circuit means which when employed in combination with a collector modulation system for transistor radio-frequency (R-F) power amplifiers, it is possible to achieve 100% amplitude modulation with none of the attendant clipping of peaks in one polarity of the R-F carrier encountered in prior art methods of modulation.

The new means employed in this invention is to insert a pair of diodes in the modulation transformer output circuit in such manner that the modulating signal is applied to both the driver and final power amplifier stages of a radio-frequency transmitter. The component of the modulating signal applied to the final amplifier drives the final amplifier directly. The component of the modulating signal applied through the diode means to the driver amplifier modulates the collector of the driver stage on one half cycle of the modulating signal but on the opposite half cycle is ineffective because of the polarity of the diode means which makes it non-conductive during the opposite half cycle.

Since collector modulation of transistor amplifiers is in effect a method of varying the amplitude of the output of the transistor amplifier by changing its supply voltage, the application of diodes as contemplated in this invention to the driver voltage supply circuits in conjunction with the modulating signal, the final amplifier receives additional drive voltage or power during the half cycle of the modulating signal in the same polarity as the conductive polarity of the diode through which the modulating signal is applied to the driver stage. During the modulation half-cycle in which the polarity is opposed to the conducting polarity of the diode no added drive power is supplied to the final amplifier from the driver. While the forward amplitude adds to the output power none is added in reverse phase and so the clipping usually encountered in prior art systems is eliminated.

Application of this invention makes it possible to fully (100%) modulate the amplitude of transistor radio-frequency amplifiers so that their operation is comparable to such amplifiers in vacuum tube transmitters.

Accordingly, it is an object of this invention to provide means whereby a transistor radio-frequency power amplifier may be amplitude modulated to a depth of 100% without clipping or distortion.

It is a further object of this invention to provide a means for the 100% modulation of transistor power amplifiers by the application of the modulating signal to both the power amplifier and to a driver amplifier in such manner that the modulation signal component having the same polarity as the polarity of the D-C power source applied to the collector circuits of the amplifiers modulates both the power and driver stages and the opposite polarity modulating signal modulates only the power amplifier stage.

It is another object of this invention to provide means for enhancing the amplitude of the final amplifier output on a modulating direction of the modulating signal which is of the same polarity as the supply voltage and to provide no increase in depth of modulation on the reverse polarity of the modulating signal applied at high level to a radio frequency transistor power amplifier system.

It is a still further object of this invention to provide a means whereby 100% amplitude modulation of the power amplifier of a transistor radio frequency amplifier by applying the modulating signal in series with the collector supply voltage in both polarities of the modulating envelope to the power amplifiers of said radio-frequency amplifier and through appropriately poled diodes to the driver amplifier on only one polarity of the modulating envelope so that the opposite polarity of the modulating envelope will affect only the power amplifier and not the driver amplifier.

These and other objects of the invention will become more clear from the specification which follows describing preferred embodiments of the invention which should not be construed as the only means of implementation of the invention since others skilled in the arts applying to this invention may find other means to apply the invention within the scope of the claims appended hereto when taken together with the accompanying figures in which FIGURE 1 is a schematic circuit diagram of one embodiment of this invention; and FIGURE 2 is a schematic circuit diagram of a more elaborate implementation of the invention applied to a broad band power amplifier in a radio frequency transmitter.

The circuit diagram of FIGURE 1, to which reference is now made includes a driver transistor amplifier 10 and a final power amplifier transistor 11 connected in a cascade radio frequency output power amplifier system. Transistor 10 includes a collector 12, a base 13 and an emitter 14. Transistor 11 includes a collector 15, a base 16 and an emitter 17. A source of continuous-wave radio-frequency energy 18 is connected through a coupling capacitor 19 to base 13 of transistor driver amplifier 10. A resistor 20 is connected between base 13 and a ground reference potential point 24. A coil 22 and capacitor 21 forming a parallel resonant circuit at the frequency of said source of radio frequency 18 is connected between collector 12 and a high collector potential supply point 44 from which a radio frequency by-pass capacitor 23 is connected to the reference-ground point 24. A coupling winding 26 forming a step-down secondary winding to coil 22 transfers energy to the base 16 of transistor 11 to which one end of winding 26 is connected. The other end of winding 26 is connected through a resistor 25 by-passed by a capacitor 27 to ground 24. The emitters 14–17 of both transistor 10 and 11 are grounded at 24. Coil 30 and capacitor 31 perform the same function in transistor 11 collector circuit (15) as the coil-capacitor 21–22 in transistor 10. The parallel resonant circuit 29–30 is connected between collector 15 and a high collector potential point 43. A radio-frequency by-pass capacitor 28 is connected from point 43 to ground 24. Secondary coil 31 coupled to winding 30 is the output winding of the power amplifier 10–11 connected between the antenna 32 and ground 24. A modulating transformer 33 has a primary winding 45 connected to a source 34 of modulating or intelligence signals and a secondary winding 41 with one lead connected to previously mentioned high potential point 43 and the other lead connected to high potential source 46 at its terminal 42. The source 46 is here shown as being connected with its positive pole to ground at 24 and its negative pole to terminal 42. This polarity applies to the PNP transistors shown at 10 and 11. If, however, NPN transistors had been used (and they can as well be used) then the polarity of source 46 will be reversed.

A first diode 36 is connected by its cathode 37 to high potential point 43 at the modulation transformer secondary 41. A second diode 35 is connected by its cathode 39 to high potential source point 42. If as above described NPN instead of PNP transistors had been used the polarity of diodes 35 and 36 would also be reversed. The anodes 38–40 of diodes 35 and 36 as shown in FIGURE 1 are connected together and to high potential point 43 previously mentioned to which the collector 12 of transistor 10 is returned through coil 22.

The operation of the circuit in FIGURE 1 may be described as follows:

When a source of radio frequency (R-F) potential such as 18 is applied to base 13 of transistor driver 10 the negative going half cycles are conducted through to coil and capacitor combination 21–22 resonant to the same frequency as source 18. Positive half cycles are not conducted, but the flywheel action of resonant circuit 21–22 transfers the full radio-frequency signal to the base 16 of transistor final power amplifier 11 through coil 26. Here the negative half cycles are conducted resulting after a few cycles in the buildup of a bias potential across the resistance capacitance in parallel 25–27 which biases the base 16 of transistor 11 in such manner that its operation thereof is class-C. The radio frequency output is coupled by tuned circuit 29–30 to antenna 32 via secondary winding 31. Here again, the flywheel action of circuit 29–30 maintains the integrity of the radio frequency signal despite the class-C biasing action of the base circuit elements 25–27 in base 13.

When a modulating or intelligence signal is present in the secondary winding 41 of transformer 33 the negative going half cycle adds to the already negative potential being supplied from battery source 46 to the collector of transistor 11. At this point 43 is more negative than point 42. Thus, since point 44 is less negative than either 42 or 43 both diodes 35 and 36 are conductive and the enhanced negative potential due to the modulating signal is also applied to the collector 12 of driver 10 which in turn increases the output amplitude of the signal from source 18 and amplified in driver 10 and then applied to transistor 11 thereby further adding to the output of power amplifier 11. When the positive going polarity of the modulating signal appears in winding 41 this subtracts from the potential being applied to collector 15 at point 43 and the latter point (43) is more positive than point 42. Diode 35 will therefore conduct but diode 36 will not because at the full amplitude of the positive going modulating cycle the potential at 43 will be almost equal and opposite in polarity to the applied negative potential at 42, thereby placing point 43 near zero or only slightly negative. In any event, point 43 is more positive (or less negative) than point 42. Diode 35 is therefore conducting while diode 36 is not since the anode 38 thereof is more negative than its cathode 37. Thus a modulation component more positive than the supply potential does not affect the supply voltage to the collector 12 of transistor 10 and no increase in the normal amplitude of the signal derived from source 18 and amplified by transistor 10 is provided and so only the normal degree of signal is applied from transistor 10 to transistor 11 and the modulating component effective only in the collector circuit 15, 29, 30 of transistor 11.

At (a) in FIGURE 1 the carrier in the absence of modulation from source 34 is illustrated in the constant amplitude waveform. At (b) the modulating signal as it appears in secondary 41 is indicated. At (c) the conduction waveform of diode 36 is shown and at (d) the conduction waveform of diode 35 is shown. The waveform at (e) is the resulting 100% modulated wave when the invention is used. Note that the negative going modulation component is deeper with respect to the zero line than the upward or positive going component of each cycle of the carrier which tends to shift the carrier center reference level in the more negative direction.

Referring now to FIGURE 2 the embodiment shown therein schematically includes an amplifier stage 50, a pair of stagger tuned amplifier stages 51 and 52 which form the driver amplifier, and a pair of stagger-tuned power output stages 53 and 54 forming the final amplifier.

Amplifier 50 is coupled by its base 56 through capacitor 71 to R-F source 70. Resistors 72 and 75 form a base bias voltage divider network for base 56. Resistor 73 and by-pass capacitor 74 in the emitter circuit 57 of transistor 50 provide direct current (D-C) emitter bias. Coil 77 in collector 55 tunes collector 55 of transistor 50 to the frequency of R-F source 70, or to the center frequency of a predetermined range of adjacent frequencies generated by source 70. Capacitor 76 is an R-F by-pass for coil 77 in its connection to D-C source 42 through line 106.

Capacitor 78 couples coil 77 to base 59 of transistor 51 which forms the first of the pair of driver stages (DRIVER I). Resistors 79 and 80 form a bias voltage divider for base 59. Resistor 82 and by-pass capacitor 81 form a D-C emitter bias network for emitter 60 of transistor 51. Coil 84 in collector 58 of transistor 51 is adjustable to tune any frequency in the above-mentioned R-F range of source 70. By-pass capacitor 83 is connected to coil 84 when it is connected to D-C supply line 104. Transistor 52 (identified as DRIVER II) and its circuit components 86, 87, 88, 89, 90, 110 form an R-F amplifier exactly like transistor 51 (identified as DRIVER I). Driver II is coupled to Driver I by capacitor 85. Coil 90 tunes the same R-F range as coil 84.

The transistor amplifier 53 identified as FINAL I includes inductor-capacitor circuit 92–93 connected in the base circuit 65 thereof, a grounded emitter 66 and a tuned collector 64. Collector 64 is tuned by coil 95 connected therein to modulated D-C line 105 and by-passed by R-F by-pass capacitor 94. Base 65 is coupled to coil 90 of DRIVER II by capacitor 91. The base circuit 68 of transistor amplifier 54 identified as FINAL II is tuned by coil 98 and capacitor 97 connected therein to ground 24, emitter 69 thereof is grounded. Capacitor 96 couples base 68 to coil 95. An R-F choke 100 is connected from collector 67 of amplifier 54 to modulated D-C source line 105. Capacitor 99 is an R-F by-pass capacitor for choke coil 100. Coil 101, variable capacitor 102, and fixed capacitor 103 form a pi-network output coupling means from the collector 67 of FINAL II power amplifier to antenna 64.

It is to be noted that final amplifiers I and II have a common D-C supply line 105 to the "hot" side 43 of secondary 41 of modulation transformer 33. The cold side (that is the modulation zero reference or equivalent modulation signal ground side) of secondary 41 is connected to D-C supply source point 42 of negative polarity since PNP transistors are shown in this system of FIGURE 2. With appropriate polarity reversals NPN transistors may be used. Likewise, it is to be noted that driver amplifiers I and II have a common D-C supply line 104 connected to a junction 113 between a dropping or current limiting resistor 107 and R-F choke coil 108. Resistor 107 connects to the anode 40 of diode 35. Choke 107 isolates line 104 with respect to R-F from point 44 where it connects to anode 38 of diode 36. A resistor 109 is in parallel with diode 36.

Thus, with the stagger tuned driver circuit I, II connected via diodes 35 and 36 to modulation transformer secondary 41 in the same manner as previously described for driver 10 of FIGURE 1 and with the modulation transformer secondary 41 coupled in the collector return circuit of stagger-tuned Final amplifier I, II in the same manner as for Final amplifier 11 in FIGURE 1 the basic similarity between the broad-band transmitter amplifier circuit of FIGURE 2 and the normal band-width transmitter amplifier circuit of FIGURE 1 can be seen.

As a particular but not limiting example of a range of operation for the modulated R-F amplifier of FIGURE 2 the band width thereof may cover range of frequencies between 118 mc. and 136 mc. In such a range pre-amplifier coil 77 might tune broadly with a center frequency of 127 mc. driver coils 84 and 90 might be tuned respectively to center frequencies of approximately 122.5 mc. and 131.5 mc. L–C networks 92–93 and 97–98 might tune points in between the upper and lower of the latter frequencies on either side of center frequency while coil 96 may be tuned to fill in any gap. The antenna presumably can be made to peak for any frequency in the range by adjustment of capacitor 102 and coil 101. The transmitter of FIGURE 2 is one such as may be used in aircraft where a number of channels must be used without a requirement for returning except for the antenna output.

Modulation of the transmitter is accomplished as previously described in connection with FIGURE 1 utilizing the action of diodes 35 and 36 upon the stagger-tuned groups of driver and final stages each group being acted upon as if it were a single amplifier.

What is claimed is:

1. A modulating circuit for transistor power amplifiers comprising in combination:
  a driver radio frequency amplifier means coupled to an external source of carrier signals;
  a power amplifier means coupled to said driver amplifier means;
  a source of potential of predetermined polarity for energizing said driver and said power amplifier means;
  a modulating means including modulation transformer having a primary connected to a source of modulating signals, a secondary winding having a pair of output leads, one of said pair of output leads being connected to said source of potential, the other of said leads being connected to said power amplifier means to apply said potential to said power amplifier means through said secondary winding;
  a first diode connected between said one of said pair of leads and said driver amplifier means and being poled so as to conduct said potential from said source of potential to said driver amplifier means; and
  a second diode connected between said other lead of said pair of leads and said driver amplifier and being poled in the same direction as said first diode, whereby when a modulating signal having alternate positive and negative going polarities appears in said secondary, and the polarity of said modulating signal matches that by which both said diodes are conductive, the modulating signal amplitude is added to the potential in said source of potential applied to both said amplifiers through said primary and said second diode thereby increasing the carrier amplitude of both said amplifiers, the increase in said driver amplifier providing added drive to said final amplifier to further increase the amplitude thereof, whereas during the polarity of said modulating signal opposed to the polarity of said supply potential said supply potential to said final amplifier is reduced by the amplitude of said modulating signal reducing the carrier level thereof and no effect is had upon said driver amplifier so that said final amplifier is modulated fully without ever being driven to saturation in the up modulation direction or cut off in the down modulation condition for either polarity of the modulating signal with respect to the supply potential.

2. A circuit for achieving 100% modulation of transistor radio frequency power amplifiers comprising:
  a driver amplifier means;
  a power amplifier means coupled to said driver amplifier means;
  modulating means connected to said power amplifier means for modulation thereof; and
  diode means connected between said driver amplifier means and said power amplifier means, said diode means being poled to conduct and instantaneously apply the modulating voltage signal to said driver amplifier means when said modulation means produces an upward modulating signal phase and to be non-conductive during a downward modulating signal phase, whereby during said upward modulating signal phase both said driver amplifier means and said power amplifier means are modulated by said signal and during said downward modulating signal phase only said power amplifier means is modulated by said signal thereby preventing clipping normally experienced in said downward modulating signal phase.

3. A circuit for achieving 100% modulation of transistor radio frequency power amplifiers comprising:
  a transistor driver amplifier means;
  a transistor power amplifier means coupled to said transistor driver amplifier means;
  modulating means connected to said transistor power amplifier means for modulation thereof; and
  diode means connected between said transistor driver amplifier means and said transistor power amplifier means, said diode means being poled to conduct and instantaneously apply the modulating voltage signal to said driver amplifier means when said modulation means produces an upward modulating signal phase and to be non-conductive during a downward modulating signal phase, whereby during said upward modulating signal phase both said transistor driver amplifier means and said transistor power amplifier means are modulated by said signal and during said downward modulating signal phase only said transistor power amplifier means is modulated by said signal thereby preventing clipping normally experienced in said downward modulating signal phase.

4. A circuit for achieving 100% modulation of a transistor radio-frequency power amplifier comprising:
  a driver amplifier having a first and a second stagger-tuned stage therein coupled together in cascade relation, said first stagger tuned stage of said driver amplifier being connected to an external source of continuous-wave radio-frequency energy;
  a power amplifier having a first and a second stagger-tuned stage coupled together in a cascade relation, said first stagger-tuned stage of said power amplifier being coupled to said second stagger-tuned stage of said driver amplifier;

an antenna and a coupling circuit therefor coupled to said second stagger-tuned stage of said power amplifier for radiating said radio-frequency energy;

a modulating transformer connected to an external source of modulating signals and to said power amplifier for modulating the amplitude of the radio frequency energy in said power amplifier with modulating signals from said source of modulating signals; and a diode coupling network connected between said driver amplifier and said modulation transformer, said diode coupling network being poled to conduct and instantaneously apply the modulating voltage signal to said driver amplifier means said modulating signal when said signal is in an upward modulating phase and to be non-conductive in a downward modulating phase, of said modulating signal, thereby modulating both said driver amplifier and said power-amplifier during said upward modulating phase and only said power amplifier in said downward modulating phase.

References Cited

UNITED STATES PATENTS

| | | | |
|---|---|---|---|
| 2,252,049 | 8/1941 | Terman | 332—38 X |
| 2,382,567 | 8/1945 | Hollingsworth | 325—144 |
| 2,521,052 | 9/1950 | Edwards | 332—38 |
| 2,848,686 | 8/1958 | Allen | 332—60 X |

OTHER REFERENCES

Motorola Application note AN 114 "Modulation of Driver Stage to Increase Power Output of A-M Transmitter"; 6 sheets; printed December 1960.

JOHN W. CALDWELL, *Acting Primary Examiner.*

DAVID G. REDINBAUGH, *Examiner.*

B. V. SAFOUREK, *Assistant Examiner.*